United States Patent
Yokote et al.

(10) Patent No.: US 8,274,614 B2
(45) Date of Patent: Sep. 25, 2012

(54) TELEVISION APPARATUS AND ELECTRONIC DEVICE

(75) Inventors: Satoshi Yokote, Oume (JP); Mitsuhiro Murakami, Tachikawa (JP); Kazuhiro Nakamura, Hachioji (JP); Masataka Tokoro, Tachikawa (JP); Kohei Wada, Tachikawa (JP); Tetsuo Okazaki, Hino (JP); Ryosuke Kasaya, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 7 days.

(21) Appl. No.: 13/050,553

(22) Filed: Mar. 17, 2011

(65) Prior Publication Data

US 2011/0310312 A1    Dec. 22, 2011

(30) Foreign Application Priority Data

Jun. 18, 2010 (JP) ................................ 2010-139819

(51) Int. Cl.
*H04N 5/64* (2006.01)

(52) U.S. Cl. ....................................... 348/836; 348/838

(58) Field of Classification Search .................. 348/836, 348/838
See application file for complete search history.

(56) References Cited

U.S. PATENT DOCUMENTS

| | | | |
|---|---|---|---|
| 5,953,206 A | 9/1999 | Jondrow | |
| 7,203,062 B2 | 4/2007 | Tsuji | |
| 7,312,988 B2 | 12/2007 | Maeda | |
| 2005/0068732 A1 | 3/2005 | Tsuji | |

FOREIGN PATENT DOCUMENTS

| | | |
|---|---|---|
| JP | 11-219236 | 8/1999 |
| JP | 2002-091611 | 3/2002 |
| JP | 2005-086006 | 3/2005 |
| JP | 2005086006 A * | 3/2005 |
| JP | 2005-107122 | 4/2005 |
| JP | 2005107122 A * | 4/2005 |
| JP | 2005-175669 | 6/2005 |
| JP | 2006-064910 | 3/2006 |
| JP | 2008-243201 | 10/2008 |
| JP | 2010-033103 | 2/2010 |
| WO | WO 2005/029299 | 3/2005 |

OTHER PUBLICATIONS

Notice of Rejection mailed by the Japan Patent Office on Jun. 21, 2011 in the corresponding Japanese patent app. No. 2010-139819 in 5 pages.

* cited by examiner

*Primary Examiner* — Sath V Perungavoor
*Assistant Examiner* — Jeffery Williams
(74) *Attorney, Agent, or Firm* — Knobbe Martens Olson & Bear LLP

(57) ABSTRACT

According to one embodiment, a television apparatus includes a main body, a housing, an exothermic component, and a heat transfer mechanism. The main body has a display screen, and is used in a first orientation where one side of the display screen is positioned on the upper side and in a second orientation where another side is positioned on the upper side. The housing at least partially constitutes the outline of the main body. The exothermic component is housed in the housing. The heat transfer mechanism includes a heat receiving portion that receives heat from the exothermic component, a heat releasing portion that releases heat, and a heat transferring portion that houses a medium to transfer heat from the heat receiving portion to the heat releasing portion. In both the first orientation and the second orientation, the heat receiving portion is located lower than the heat releasing portion.

19 Claims, 14 Drawing Sheets

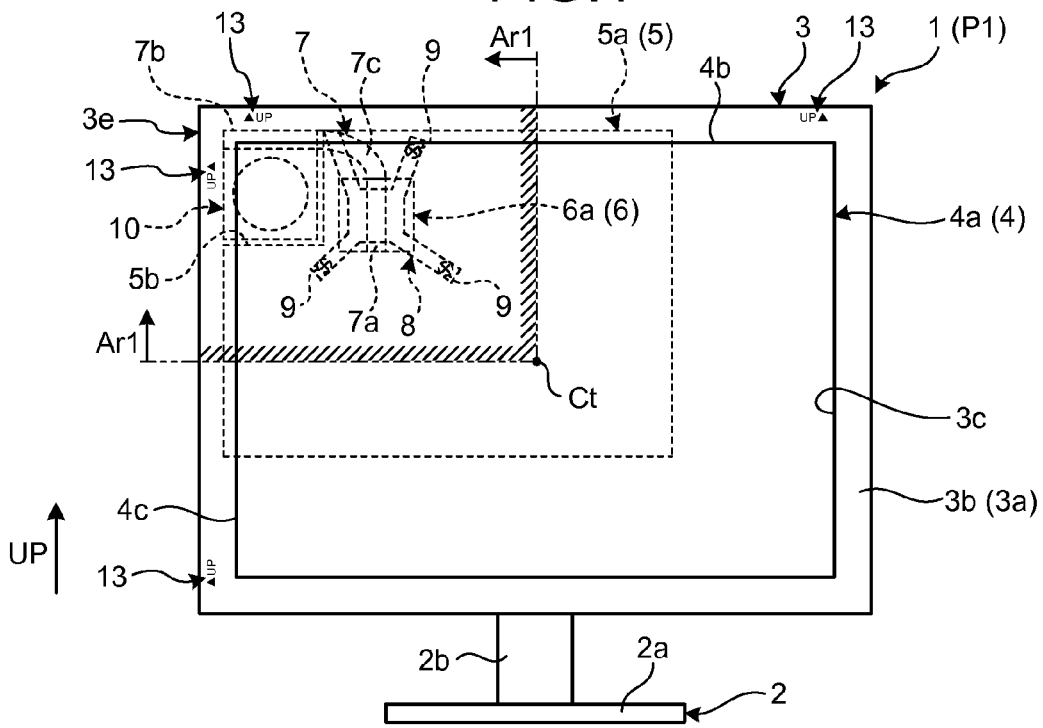
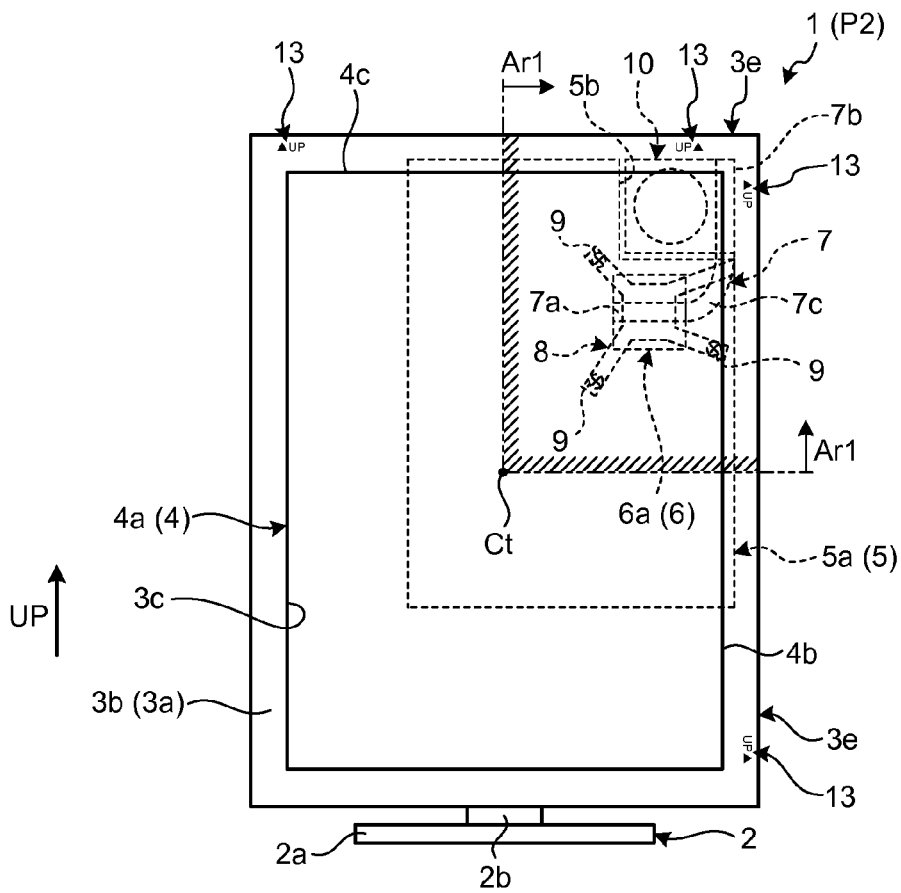

TELEVISION APPARATUS AND ELECTRONIC DEVICE

CROSS-REFERENCE TO RELATED APPLICATIONS

This application is based upon and claims the benefit of priority from Japanese Patent Application No. 2010-139819, filed Jun. 18, 2010, the entire contents of which are incorporated herein by reference.

FIELD

Embodiments described herein relate generally to a television apparatus and an electronic device.

BACKGROUND

Typically, known electronic devices house an exothermic component behind a display panel inside the housing.

With regard to such electronic devices, there is a demand for preventing the device temperature from rising.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 1 is an exemplary front view of a first orientation of a television apparatus as an electronic device according to a first embodiment;

FIG. 2 is an exemplary front view of a second orientation of the television apparatus in the first embodiment;

DETAILED DESCRIPTION

Figure 3:
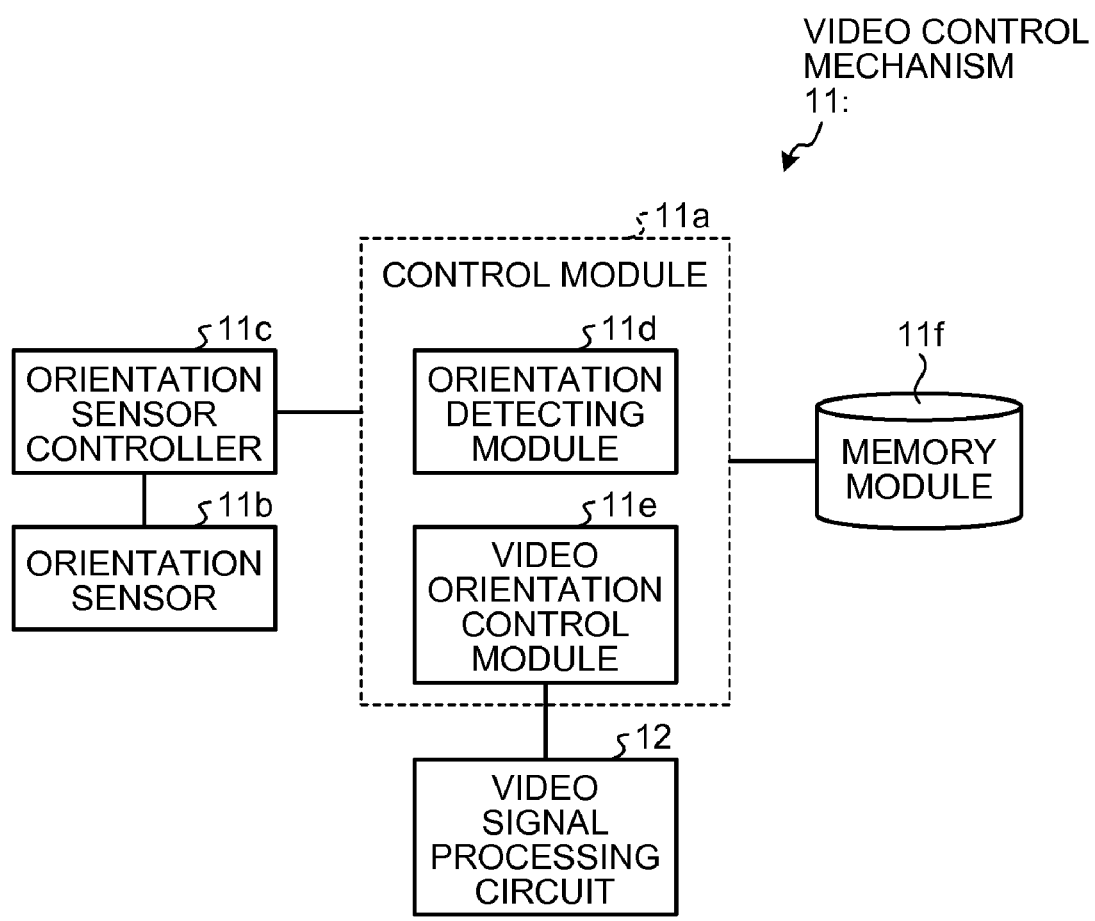
FIG. 3 is an exemplary block diagram of a video control mechanism in the television apparatus in the first embodiment.

In general, according to one embodiment, a television apparatus comprises a main body, a housing, an exothermic component, and a heat transfer mechanism. The main body comprises a rectangular display screen, and is configured to be used in a first orientation in which one side of the display screen is positioned on the upper side and in a second orientation in which another side of the display screen perpendicular to the one side is positioned on the upper side. The housing is configured to at least partially constitute the outline of the main body. The exothermic component is housed in the housing. The heat transfer mechanism is at least partially housed in the housing. The heat transfer mechanism comprises a heat receiving portion configured to receive heat from the exothermic component, a heat releasing portion configured to release heat, and a heat transferring portion configured to house a medium that transfers heat from the heat receiving portion to the heat releasing portion. In both the first orientation and the second orientation, the heat receiving portion is located lower than the heat releasing portion.

According to another embodiment, a television apparatus comprises a main body, a housing, an exothermic component, and a heat transfer mechanism. The main body comprises a rectangular display screen, and is configured to be used in a first orientation in which one side of the display screen is positioned on the upper side and in a second orientation in which another side of the display screen perpendicular to the one side is positioned on the upper side. The housing is configured to at least partially constitute the outline of the main body and be rectangular in shape when viewed from the front of the display screen. The exothermic component is housed in the housing. The heat transfer mechanism is at least partially housed in the housing. The heat transfer mechanism comprises a heat receiving portion configured to receive heat from the exothermic component, a heat releasing portion configured to release heat, and a heat transferring portion configured to house a medium that transfers heat from the heat receiving portion to the heat releasing portion. In both the first orientation and the second orientation, the heat receiving portion is located lower than the heat releasing portion.

In the embodiments described below, the identical constituent elements are referred to by the same reference numerals, and repetition is avoided in the explanation of such constituent elements. In the accompanying drawings, "UP" represents the upper side in the operating state.

As illustrated in FIGS. 1 and 2, a television apparatus 1 as an electronic device according to a first embodiment comprises a stand 2 and a main body 3 that is supported by the stand 2.

The stand 2 has a base 2a and a leg 2b that extends from the base 2a to the rear side of the central portion of the main body 3. To the fore-end (not illustrated) of the leg 2b, the tail end (rear end) (not illustrated) of a housing 3a of the main body 3 is rotatably supported via a hinge mechanism (not illustrated) made of, for example, ball joints or universal joints. The television apparatus 1 has a pivot function, with which the television apparatus 1 can be used in a landscape-style first orientation P1 (FIG. 1) in which a side 4b of a display screen 4a is positioned on the upper side, and can be used in a portrait-style second orientation P2 (FIG. 2) in which another side 4c of the display screen 4a is positioned on the upper side.

The main body 3 comprises a display panel 4 such as a liquid crystal display (LCD) and a circuit board 5a. The display panel 4 is a display device (display) having the display screen 4a exposed anteriorly from an opening 3c formed on a front face 3b of the housing 3a. The circuit board 5a has electronic components such as a central processing unit (CPU) 6 mounted thereon. The display panel 4 and the circuit board 5a are fixed to the housing 3a with screws or the like (not illustrated). The circuit board 5a and the electronic components (not illustrated) mounted on the circuit board 5a constitute a circuit board assembly 5. In FIGS. 1 and 2, the electronic components other than the CPU 6 are not illustrated.

The display panel 4 is formed in the shape of a thin and flat rectangular parallelepiped along the front-back direction (perpendicular direction to the plane of paper of FIG. 1). The display panel 4 receives video signals from a video signal processing circuit (not illustrated), which is one of the control circuits (not illustrated) configured with the electronic components mounted on the circuit board 5a. Then, the display panel 4 displays video including still images and moving images on the display screen 4a that is positioned in the front. Apart from the video signal processing circuit, the control circuits (not illustrated) in the television apparatus 1 include a tuner module, a high-definition multimedia interface (HDMI) signal processing module, an audio-video (AV) input terminal, a remote control signal receiving module, a control module, a selector, an on-screen display interface, a memory module (such as a read only memory (ROM), a random access memory (RAM), or a hard disk drive (HDD)), and an audio signal processing circuit. The circuit board 5a (the circuit board assembly 5) is housed behind (on the rear side of) the display panel 4 inside the housing 3a. Meanwhile, the television apparatus 1 has built-in amplifiers or speakers (not illustrated) for the purpose of audio output.

In the present embodiment, the abovementioned control circuits also include a video control mechanism 11 illustrated in FIG. 3 for controlling video to be displayed on the display screen 4a depending on the orientation of the main body 3. The video control mechanism 11 comprises, for example, a control module 11a, an orientation sensor 11b, an orientation sensor controller 11c, and a memory module 11f. Moreover, the control module 11a comprises an orientation detecting module 11d and a video orientation control module 11e. To a video signal processing circuit 12, the video control mechanism 11 sends control data used for the purpose of controlling the orientation (direction) of the video on the display screen 4a.

The orientation sensor 11b can be configured with, for example, a gyroscope, an acceleration sensor, or a magnetic sensor. The orientation sensor controller 11c generates an orientation detection signal upon receiving a signal representing the detection result from the orientation sensor 11b, and then sends the orientation detection signal to the control module 11a.

Based on the orientation detection signal, the orientation detecting module 11d detects (determines) the orientation of the main body 3. Herein, the orientation detecting module 11d is configured to detect at least the first orientation P1 and the second orientation P2. In order to detect (determine) the orientation of the main body 3, the orientation detecting module 11d can compare the orientation detection signal with data stored in the memory module 11f, which can be a nonvolatile memory module such as an HDD or a nonvolatile RAM (NVRAM).

Based on the detection result (determination result), the video orientation control module 11e generates control data that enables determination of whether the main body 3 has the first orientation P1 (FIG. 1) or the second orientation P2 (FIG. 2) or some other orientation, and sends the control data to the video signal processing circuit 12. Based on that control data, the video signal processing circuit 12 generates video signals that correspond to the orientation of the main body 3. That is, if the main body 3 has the first orientation P1, then the video signal processing circuit 12 generates video signals having the side 4b of the display screen 4a positioned on the upper side. Similarly, if the main body 3 has the second orientation P2, then the video signal processing circuit 12 generates video signals having the side 4c of the display screen 4a positioned on the upper side. Thus, on the display screen 4a of the display panel 4, video is displayed according to the generated video signals. Meanwhile, the video control mechanism 11 can be configured to perform control such as adjustment, magnification, reduction, or arrangement of the video range according to the orientation of the main body 3.

In the present embodiment, if the main body 3 has an orientation other than the first orientation P1 (FIG. 1) and the second orientation P2 (FIG. 2), then the video signal processing circuit 12 does not generate any video signal corresponding to that orientation, and either generates video signals corresponding to either one of the first orientation P1 and the second orientation P2 or does not generate video signals at all. That is because, in the television apparatus 1 according to the present embodiment, the first orientation P1 and the second orientation P2 are defined to be the correct orientations. For that reason, regarding an orientation other than the first orientation P1 or the second orientation P2, video that is inverted either vertically or horizontally get displayed on the display screen 4a or no video get displayed at all. Hence, the video displayed on the display screen 4a can be used to urge the user to set the orientation to either one of the orientations P1 and P2. Thus, in the present embodiment, the operations of the video control mechanism 11 make it possible to restrain the user from setting the main body 3 in an orientation other than the first orientation P1 or the second orientation P2. Moreover, with respect to the case when the main body 3 is set in an incorrect orientation, the video control mechanism 11 can be configured to control the video signal processing circuit 12 in such a way that certain characters or images are displayed for the purpose of notifying the user that the main body 3 is not in a correct orientation or that the main body 3 needs to be set in a correct orientation. Furthermore, it is also possible to configure an audio control mechanism (not illustrated) as one of the control circuits so that the user can be notified by audio about the fact that the main body 3 is not in a correct orientation or that the main body 3 needs to be set in a correct orientation.

In the present embodiment, on the front face 3b of the housing 3a is disposed a display element 13 for the purpose of displaying at least one orientation (in the present embodiment, both orientations) of the first orientation P1 and the second orientation P2. The display element 13 can be configured to display a symbol or a character representing the upper side. Thus, in the present embodiment, the display element 13 is used to notify the user about the correct orientations so that the user can be restrained from setting the main body 3 in an orientation other than the first orientation P1 or the second orientation P2. That is, in the present embodiment, the display element 13 is configured as an orientation notifying element for visually notifying the user that the correct orientation is set. Moreover, the user can also sometimes determine the correct orientation (vertical direction) by looking at the orientation of the symbol or the character. That eliminates the need to make use of words or text explaining the orientation. Thus, for example, only a logo would suffice.

Furthermore, it is also possible to configure an engagement mechanism (not illustrated) for enabling mechanical engagement between a portion of the stand 2 and a portion of the main body 3. As a result, the main body 3 can be prevented from moving farther to the opposite direction of the second orientation P2 than the first orientation P1 or can be prevented from moving farther to the opposite direction of the first orientation P1 than the second orientation P2.

As illustrated in FIGS. 1 and 2, the CPU 6 that is an exothermic electronic component is mounted on the circuit board 5a. On the die (not illustrated) of the CPU 6 is mounted a heat releasing block 6a, and on the heat releasing block 6a is mounted a heat receiving portion 7a of a heat pipe 7 that functions as a heat transfer mechanism. The heat receiving portion 7a is pressed against the heat releasing block 6a with a pressing member 8, which is fixed to the circuit board 5a using screws 9 as fastening members. In such a configuration, the heat generated by the exothermic CPU 6 is transferred to the heat receiving portion 7a via the heat releasing block 6a.

The heat pipe 7 functioning as the heat transfer mechanism is a pipe having, for example, an elongated flattened cross-section and is made of a metallic component (such as copper alloy) having relatively high heat conductivity. One end of that pipe constitutes the heat receiving portion 7a, while the other end thereof constitutes a heat releasing portion 7b. The portion in between the heat receiving portion 7a and the heat releasing portion 7b is a heat transferring portion 7c. On the outside of the heat releasing portion 7b are attached fins (not illustrated in FIGS. 1 and 2) that are made of thin sheets of a metallic component (such as copper alloy) having relatively high heat conductivity. Moreover, inside the housing 3a, at a position adjacent to the heat releasing portion 7b is installed a fan 10 that has a thin flat appearance in the thickness direction of the circuit board 5a and that comprises a rotor (not illustrated) rotating around a rotary shaft positioned along the perpendicular direction to the front and rear faces of the circuit board 5a. The rotor of the fan 10 is rotated using an electric motor so that, for example, the air that is taken in from the housing 3a through air inlets (not illustrated) formed on both sides of the axial direction of the rotary shaft (i.e., formed on the front side and on the rear side) is discharged through an exhaust outlet (not illustrated) formed opposite to the heat releasing portion 7b. That is, the air flow discharged by the fan 10 reaches the heat releasing portion 7b and the fins, as a result of which the heat releasing portion 7b and the fins are subjected to cooling. Meanwhile, the fan 10 is fit in an L-shaped notch 5b formed at a corner of the circuit board 5a.

Within the heat pipe 7 is enclosed a heat transfer medium such as the alternative for chlorofluorocarbon having relatively high volatility. Inside the heat pipe 7, the heat transfer medium at the heat receiving portion 7a first evaporates into gas due to the heat generated by the CPU 6, then reaches the heat releasing portion 7b in the gaseous state via the heat transferring portion 7c, and then condenses to liquid by getting cooled at the heat releasing portion 7b. The heat transfer medium in the liquid state returns from the heat releasing portion 7b to the heat receiving portion 7a via the heat transferring portion 7c, and evaporates into gas at the heat receiving portion 7a. Thus, the heat transfer medium absorbs latent heat at the heat receiving portion 7a and releases that latent heat at the heat releasing portion 7b. As a result, the heat gets transferred from the heat receiving portion 7a to the heat releasing portion 7b. That is, the heat generated by the exothermic CPU 6 is transferred to the heat releasing portion 7b via the heat receiving portion 7a and the heat transferring portion 7c (through the heat transfer medium flowing therein) and is then transferred from the heat releasing portion 7b into the air flow, which is then discharged to the outside of the housing 3a through an exhaust outlet 3d formed therein.

As can be seen in FIGS. 1 and 2 according to the present embodiment, in the first orientation P1 (FIG. 1) as well as in the second orientation P2 (FIG. 2), the heat receiving portion 7a is positioned on the lower side of the heat releasing portion 7b. An example of achieving such an arrangement of the heat receiving portion 7a and the heat releasing portion 7b is as follows. Consider the case in the first orientation P1 when the side 4c of the display screen 4a, which gets positioned on the upper side in the second orientation P2, lies on either the right side or the left side (on the left side in the present embodiment) and on the lower side of the side 4b of the display screen 4a, which gets positioned on the upper side in the first orientation P1. In that case, in the first orientation P1, the heat receiving portion 7a can be disposed on the other side from among the right side and the left side (i.e., on the right side in the present embodiment) and on the lower side of the heat releasing portion 7b. In the heat pipe 7 functioning as the heat transfer mechanism, in case the heat receiving portion 7a is positioned on the upper side of the heat releasing portion 7b thereby forming what is called a top heat condition, the heat transfer medium in the liquid state does not easily return to the heat receiving portion 7a from the heat releasing portion 7b. That causes a decline in the heat transfer efficiency, that is, in the heat releasing efficiency. In view of this, in the present embodiment, the heat receiving portion 7a is positioned on the lower side of the heat releasing portion 7b in both of the first orientation P1 (FIG. 1) and the second orientation P2 (FIG. 2) that are defined to be the correct orientations. Hence, it becomes possible to prevent the heat transfer efficiency, that is, the heat releasing efficiency from declining.

Moreover, in the present embodiment, the heat releasing portion 7b is disposed at a corner 3e that lies at the upper end of the housing 3a in the first orientation P1 (FIG. 1) and in the second orientation P2 (FIG. 2). Since the heat is prone to rise inside the housing 3a due to the air current, disposing the heat releasing portion 7b at the corner 3e, which lies at the upper end of the housing 3a in both of the first orientation P1 and in the second orientation P2, makes it possible to prevent heat accumulation from occurring inside the housing 3a.

Figure 4:
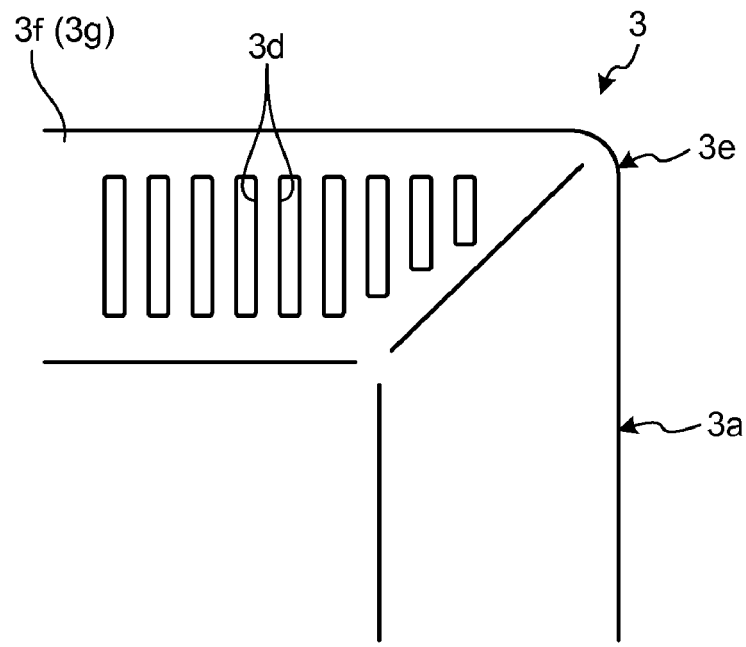
FIG. 4 is an exemplary rear view of a corner of a housing of the television apparatus in the first embodiment.
Figure 5:
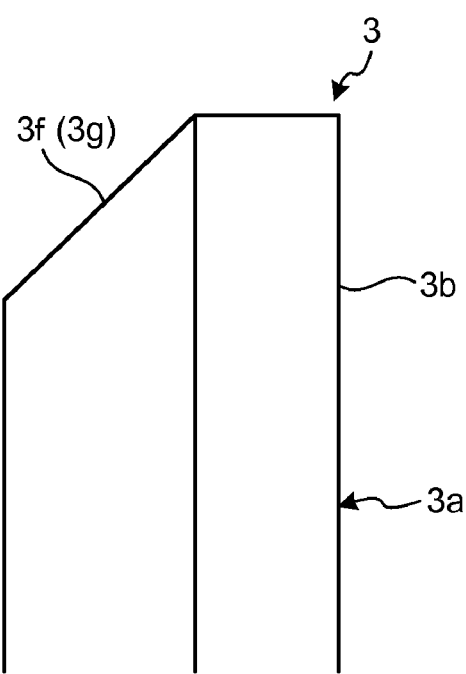
FIG. 5 is an exemplary side view of the corner of the housing of the television apparatus in the first embodiment.

In the present embodiment, as illustrated in FIGS. 4 and 5, an inclined face 3f that has the normal direction going upward and backward is formed behind (on the rear side of) the housing 3a. At the corner 3e of the housing 3a, the exhaust outlet 3d is formed on an inclined wall 3g of the inclined face 3f. Thus, the air flow, which is generated by the fan 10 and which gets heated by passing through the heat releasing portion 7b formed at the corner 3e, is discharged more smoothly from the exhaust outlet 3d that is formed at the corner 3e of the housing 3a and that faces the heat releasing portion 7b from up close. As a result, heat accumulation is prevented from occurring inside the housing 3a. Moreover, the air flow that gets heated while passing through the heat releasing portion 7b is prevented from getting discharged to the front side of the main body 3.

In the present embodiment, when viewed from the front of the display screen 4a (i.e., when viewed along the line of sight of FIGS. 1 and 2), the exothermic CPU 6 is disposed above a center Ct (inside the housing 3a) of the main body 3 in both of the first orientation P1 and the second orientation P2 (i.e., in the present embodiment, the CPU 6 is disposed in a rectangular area An on the left side of the center Ct on the display screen 4a illustrated in FIG. 1). Hence, the ascending air current generated inside the housing 3a due to the heat of the exothermic CPU 6 or the air flow drawn in the fan 10 travels a relatively long distance inside the housing 3a. AS a result, it becomes possible to prevent the occurrence of a situation in which the electronic components disposed over a wide area inside the housing 3a are easily affected due to the heat. Moreover, if it is assumed that the exothermic CPU 6 lies at the center Ct, then there is a possibility that the heated air accumulates in the area on the opposite side of the exhaust outlet 3d with respect to the center Ct inside the housing 3a. In view of this, in the present embodiment, in both of the first orientation P1 and the second orientation P2, the exothermic CPU 6 is disposed in the area on the side of the exhaust outlet 3d with respect to the center Ct. Consequently, the heated air gets easily discharged to the outside of the housing 3a.

Figure 6:
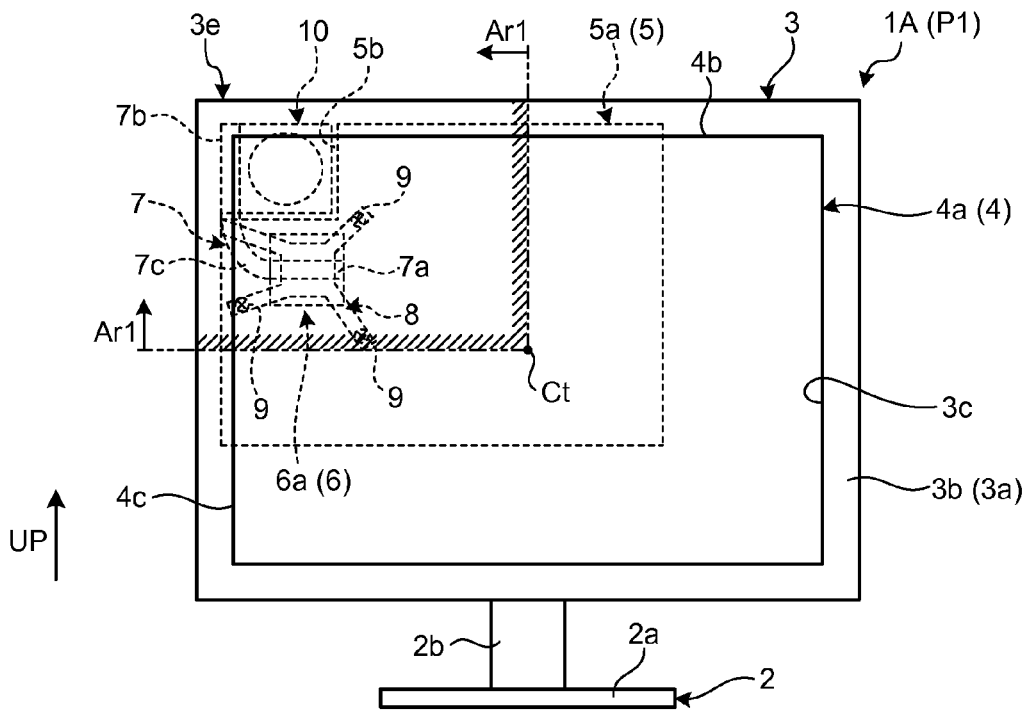
FIG. 6 is an exemplary front view of a first orientation of a television apparatus as an electronic device according to a second embodiment.
Figure 7:
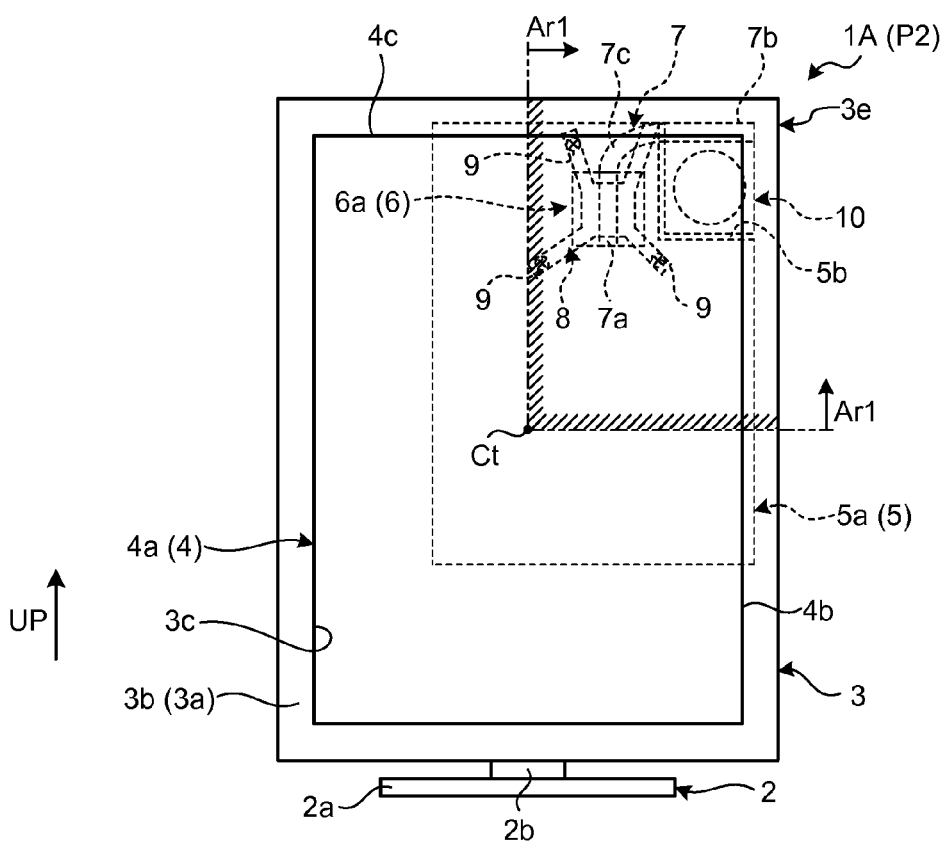
FIG. 7 is an exemplary front view of a second orientation of the television apparatus in the second embodiment.

As illustrated in FIGS. 6 and 7, a television apparatus 1A as an electronic device according to a second embodiment fundamentally has the same configuration as that of the television apparatus 1 according to the first embodiment illustrated in FIGS. 1 and 2.

However, in the television apparatus 1A according to the second embodiment, the CPU 6, the heat pipe 7, and the exhaust outlet 3d inside the housing 3a are arranged in a different manner than the arrangement in the first embodiment. More particularly, in the present embodiment, the arrangement of the CPU 6, the heat pipe 7, and the exhaust outlet 3d in the first orientation P1 illustrated in FIG. 6 is identical to (although mirror image of) the arrangement in the second orientation P2 according to the first embodiment illustrated in FIG. 2. Similarly, the arrangement of the CPU 6, the heat pipe 7, and the exhaust outlet 3d in the second orientation P2 illustrated in FIG. 7 is identical to (although mirror image of) the arrangement in the first orientation P1 according to the first embodiment illustrated in FIG. 1. In this configuration also, the heat receiving portion 7a is positioned on the lower side of the heat releasing portion 7b in both of the first orientation P1 and the second orientation P2. Consequently, in the second embodiment also, in an identical manner to the first embodiment, positioning the heat receiving portion 7a on the lower side of the heat releasing portion 7b makes it possible to prevent the heat transfer efficiency, that is, the heat releasing efficiency from declining.

Figure 8:
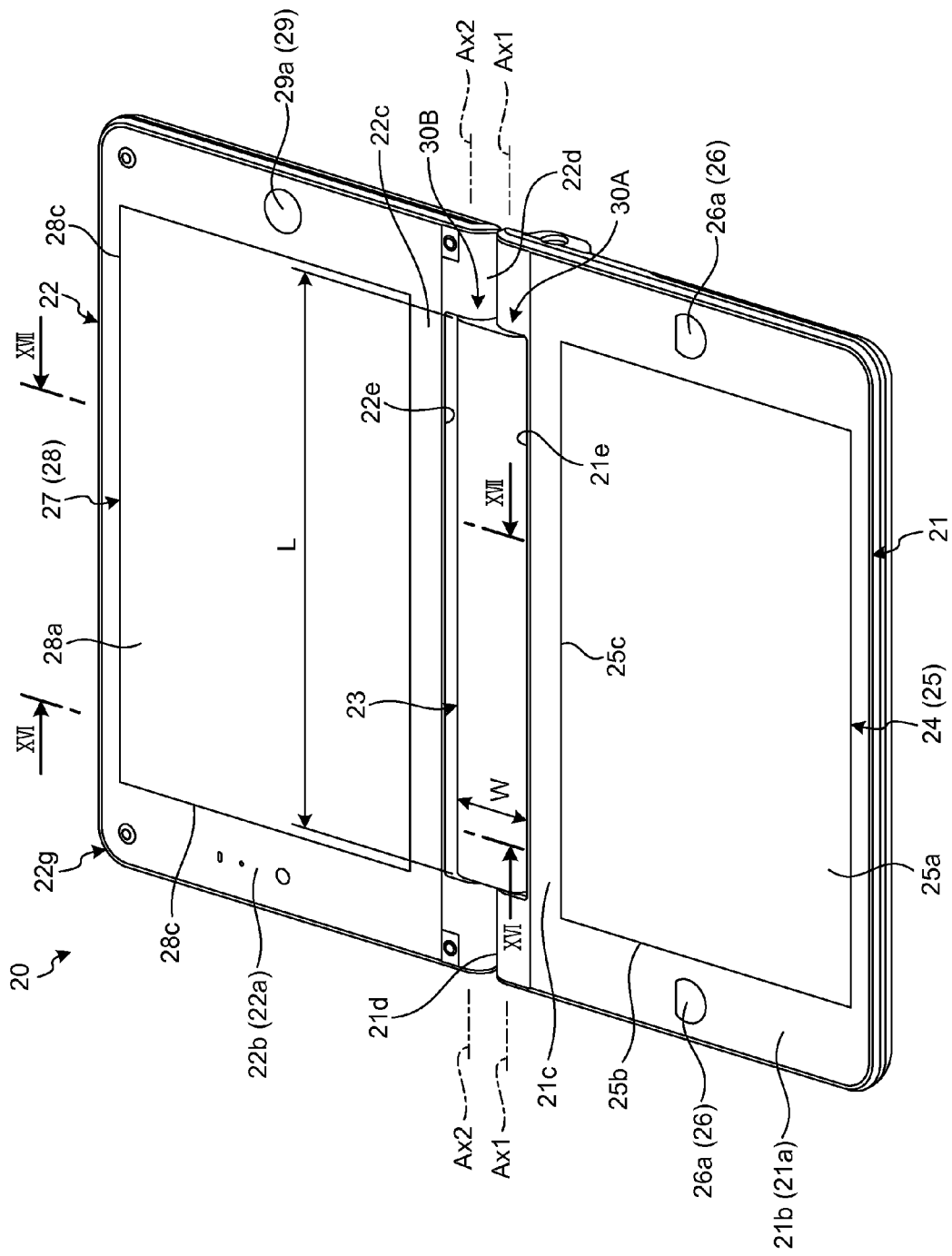
FIG. 8 is an exemplary perspective view of an open state of a personal computer (PC) as an electronic device according to a third embodiment.

According to a third embodiment, a notebook personal computer (PC) 20 as an electronic device comprises a rectangular and flat first main body 21 and a rectangular and flat second main body 22 as illustrated in FIG. 8. The first main body 21 and the second main body 22 are connected in a relatively rotatable manner via a joint 23.

In the first main body 21, a display panel 25 such as an LCD, which is a display device having a touch panel 24 on the front face (i.e., on a display screen 25a), and a push button mechanism 26 are arranged in an exposed manner on a front face 21b that is the external face of a housing 21a. Similarly, in the second main body 22, a display panel 28 such as an LCD, which is a display device having a touch panel 27 on the front face (i.e., on a display screen 28a), and a push button mechanism 29 are arranged in an exposed manner on a front face 22b that is the external face of a housing 22a.

In the open state illustrated in FIG. 8, the display panel 25 and cover bodies 26a of the push button mechanism 26 as well as the display panel 28 and a cover body 29a of the push button mechanism 29 lie in an exposed condition. In such a state, the user is able to perform operations. In contrast, in a folded state (not illustrated), the front faces 21b and 22b face each other from up close in such a way that the display panel 25 and the cover bodies 26a of the push button mechanism 26 are hidden by the housing 21a, while the display panel 28 and the cover body 29a of the push button mechanism 29 are hidden by the housing 22a. In the present embodiment, the touch panels 24 and 27, the push button mechanisms 26 and 29, and a microphone (not illustrated) function as input operation modules, while the display panels 25 and 28 and speakers (not illustrated) function as output operation modules. Meanwhile, in the PC having a keyboard, or click buttons, or a pointing device (not illustrated), the keyboard or the click buttons also function as input operation modules.

The joint 23 connects the first main body 21 with the second main body 22, and is configured separately from the first main body 21 and the second main body 22. The joint 23 connects an end portion 21c at the base end of the first main body 21 with an end portion 22c at the base end of the second main body 22. At the central part in the longitudinal direction of an end edge 21d of the end portion 21c and at the central part in the longitudinal direction of an end edge 22d of the end portion 22c, rectangular notches 21e and 22e are formed, respectively, except over the respective ends. Each of the rectangular notches 21e and 22e has a long opening along the longitudinal direction and has only a shallow depth. Half of the joint 23 is inserted in the notch 21e and the remaining half thereof is inserted in the notch 22e. A length L of the joint 23 is set to be slightly shorter than the width of the notches 21e and 22e. Moreover, a width W of the joint 23 is set to be substantially equal to the thickness when the first main body 21 and the second main body 22 are closed together in the folded state.

The first main body 21 and the joint 23 are connected in a relatively rotatable manner around a rotation axis Ax1 via a first hinge mechanism 30A. Similarly, the second main body 22 and the joint 23 are connected in a relatively rotatable manner around a rotation axis Ax2 via a second hinge mechanism 30B. The rotary shafts Ax1 and Ax2 lie parallel to each other. In the present embodiment, the first hinge mechanism 30A and the second hinge mechanism 30B are coupled together so that the relative rotation angle around the rotation axis Ax1 of the first main body 21 with respect to the joint 23 is identical to the relative rotation angle around the rotation axis Ax2 of the second main body 22 with respect to the joint 23. However, the two relative rotation directions with respect to the joint 23 are opposite to each other. Thus, when the user operates the joint 23 for the purpose of opening either one of the first main body and the second main body 22, the PC 20 falls into the open state. Similarly, when the joint 23 is operated for the purpose of closing either one of the first main body 21 and the second main body 22, the PC 20 falls into the folded state. Moreover, when the user opens the first main body 21 and the second main body 22, the PC 20 falls into the open state. Similarly, when the first main body 21 and the second main body 22 are closed, the PC 20 falls into the folded state.

Figure 9:
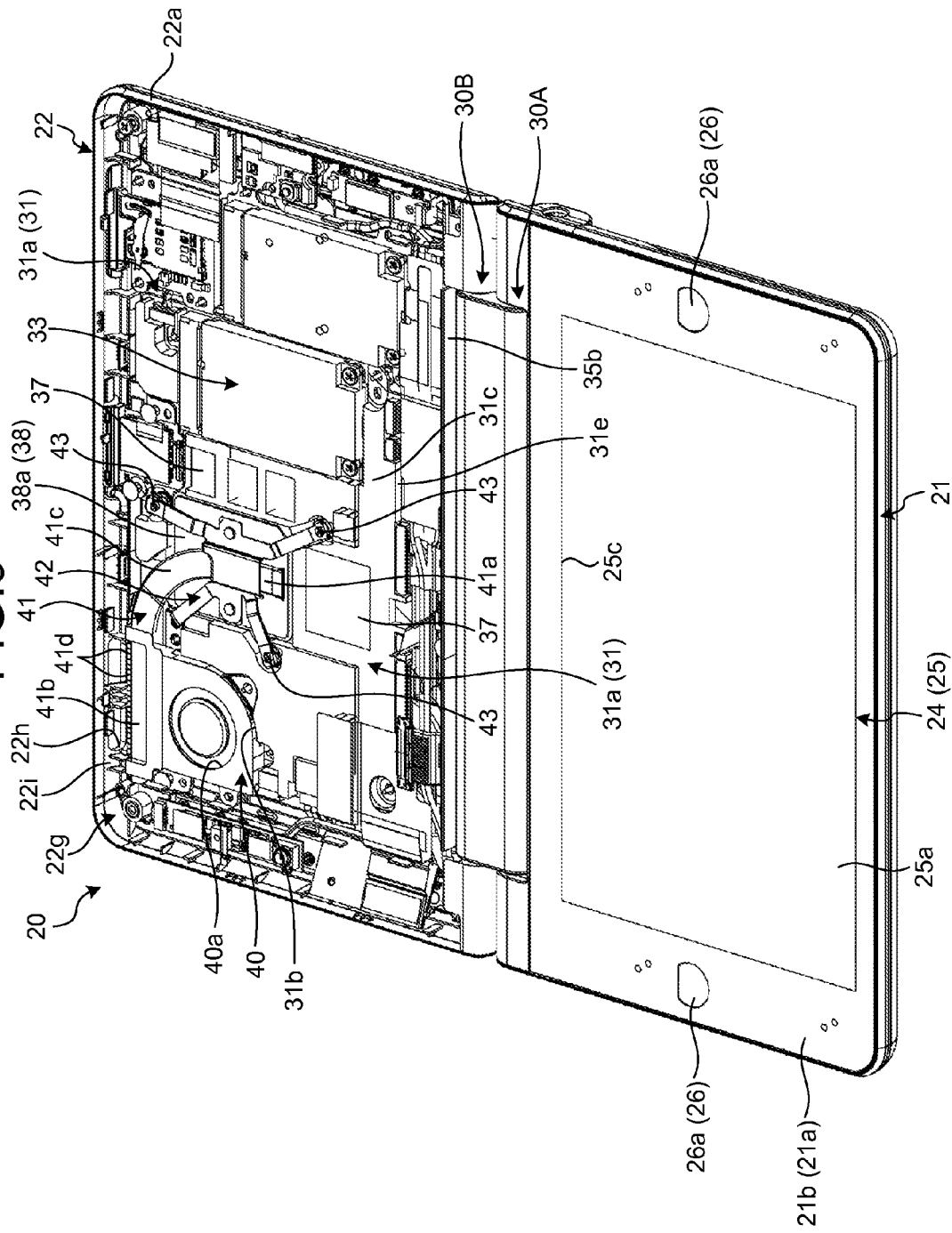
FIG. 9 is an exemplary perspective view of the PC illustrated in FIG. 8 without a display panel of a second main body in the third embodiment.
Figure 10:
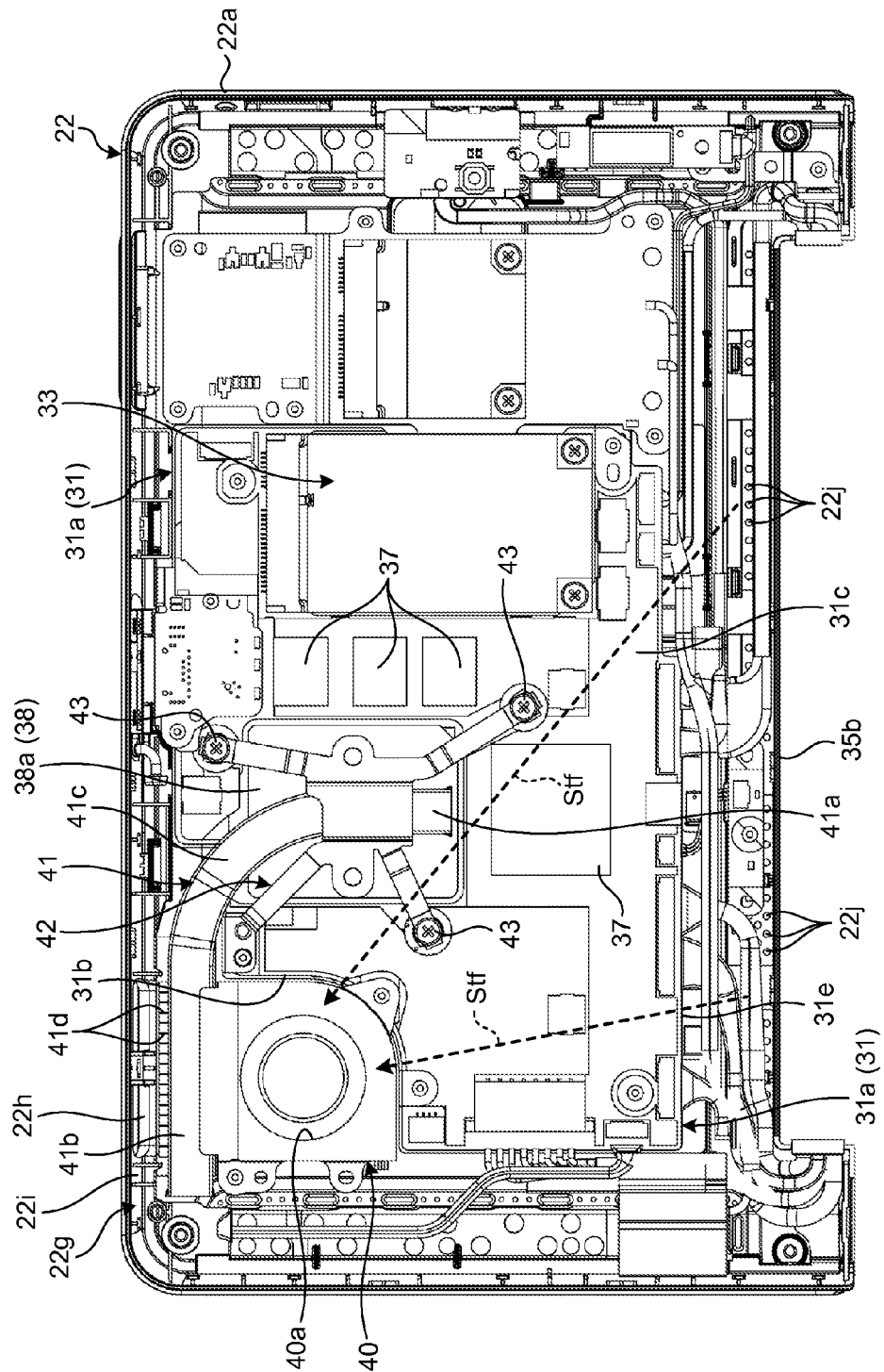
FIG. 10 is an exemplary front view of the PC without the display panel of the second main body in the third embodiment.
Figure 11:
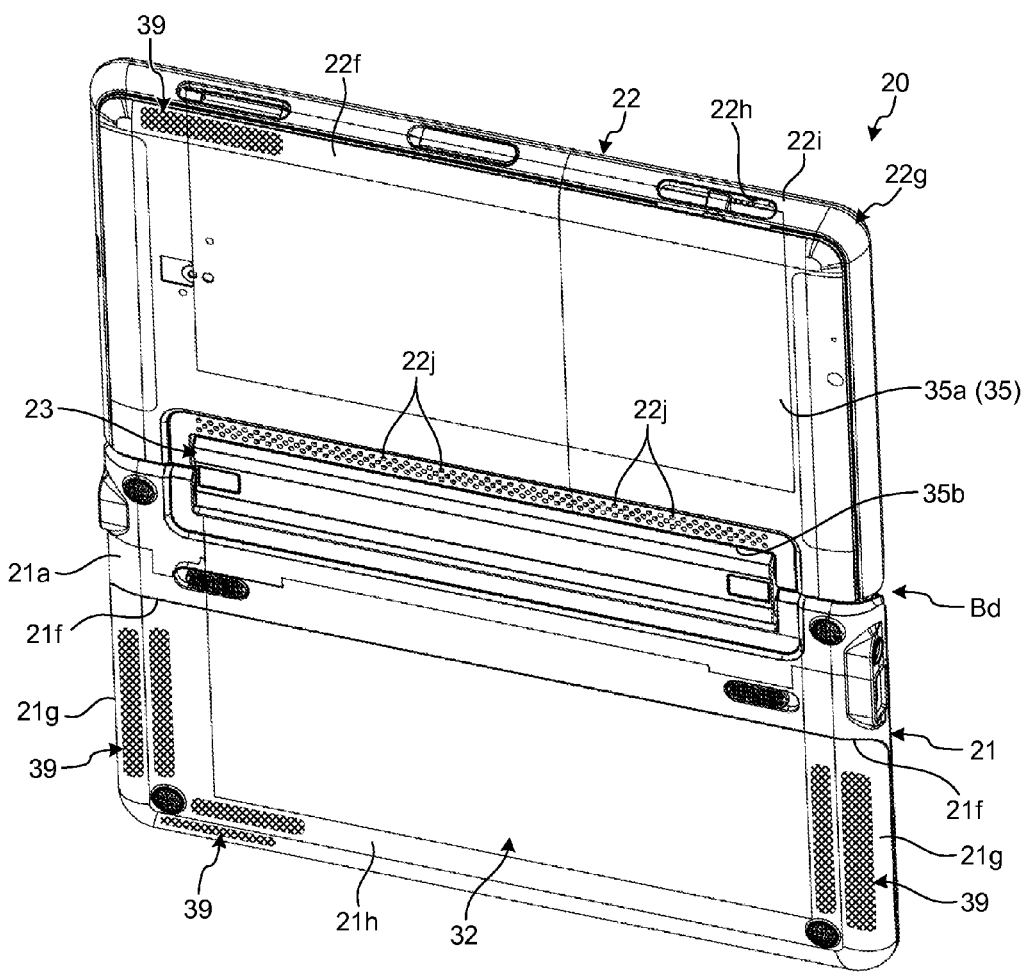
FIG. 11 is an exemplary rear perspective view of the open state of the PC in the third embodiment.

In the present embodiment, as illustrated in FIGS. 9 and 10, a circuit board 31a (a circuit board assembly 31, see FIGS. 9 and 10) with at least some of the control circuits including electronic components mounted thereon is disposed, for example, inside the housing 22a of the second main body 22. In the housing 22a, the display panel 28 and the circuit board 31a are fixed with screws or the like (not illustrated). Meanwhile, as illustrated in FIG. 11, in the first main body 21, a battery 32 is disposed as a power supply behind (on the rear side of) the display panel 25. On the rear side of the first main body 21, a depressed portion 21f is formed that is rectangular in appearance when viewed from the back. The depressed portion 21*f* gets covered by the battery 32 when the battery 32 is detachably attached to the housing 21*a* of the first main body 21. Thus, in the present embodiment, the circuit board 31*a* (the circuit board assembly 31) with the main electronic components such as a CPU 38 mounted thereon is disposed in the second main body 22, while the battery 32 is disposed in the first main body 21. In case the circuit board assembly 31 and the battery 32 are disposed together in either one of the first main body 21 and the second main body 22, then following inconveniences are more likely to occur. For example, the thickness of the main bodies increases or, if there is a restriction on the thickness, then it becomes necessary to reduce the size and eventually the capacity of the battery 32. In contrast, in the present embodiment, the circuit board assembly 31 and the battery 32 are separately disposed in the second main body 22 and the first main body 21, respectively. That makes it possible to avoid the abovementioned inconveniences. In this regard, however, in a first usage pattern U1 illustrated in FIG. 12, the first main body 21 is larger in mass than the second main body 22 so that the PC 20 can be stably placed on a desk or the like. In the present embodiment, the first main body 21 corresponds to a different main body that is connected to the second main body 22, which houses the circuit board assembly 31, in a relatively rotatable manner via the hinge mechanisms 30A and 30B. Moreover, the display screen 25*a* of the display panel 25 in the first main body 21 corresponds to a different display screen.

Figure 12:
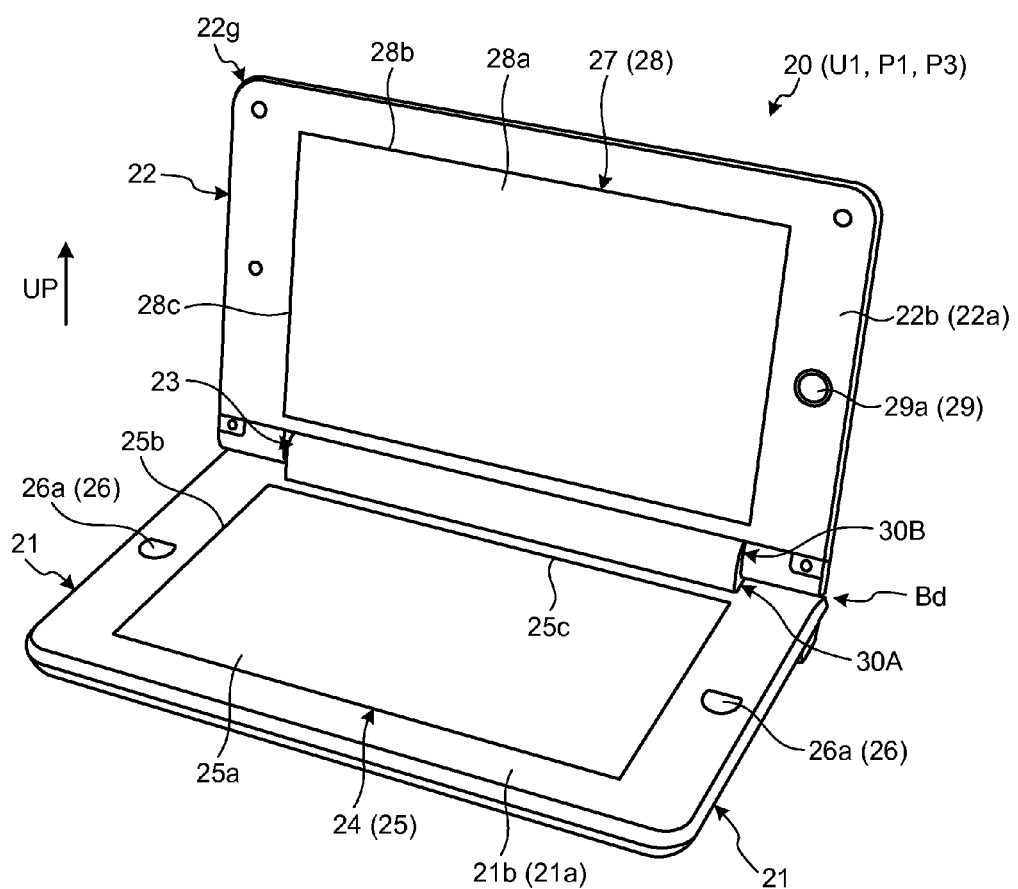
FIG. 12 is an exemplary perspective view of a first usage pattern of the PC in the third embodiment.
Figure 13:
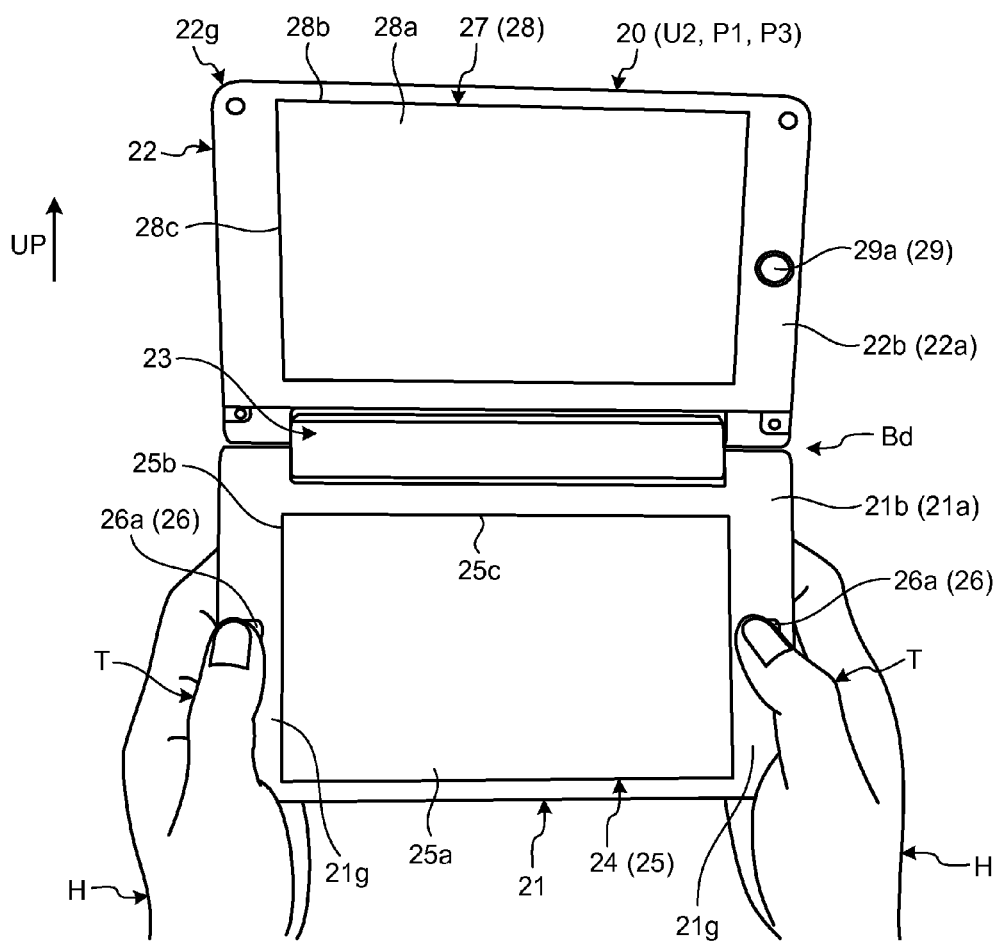
FIG. 13 is an exemplary perspective view of a second usage pattern of the PC in the third embodiment.
Figure 14:
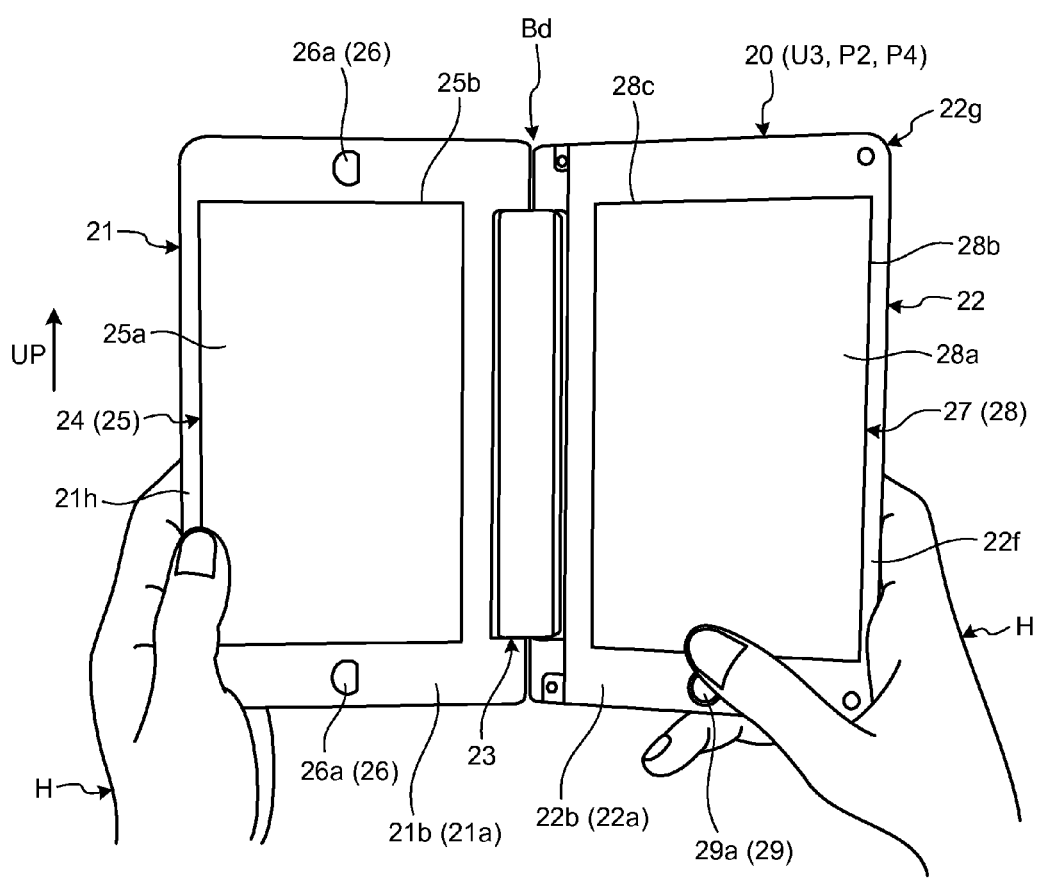
FIG. 14 is an exemplary perspective view of a third usage pattern of the PC in the third embodiment.

Apart from the first usage pattern illustrated in FIG. 12, the PC 20 according to the present embodiment can be used in a second usage pattern U2 illustrated in FIG. 13 as well as in a third usage pattern U3 illustrated in FIG. 14. As illustrated in FIG. 13, the second usage pattern U2 is such that the first main body 21 and the second main body 22 are unfolded relatively widely, and a margin portion 21*g* on both sides in the width direction of the first main body 21 is held with hands H. In this second usage pattern U2, the user holding the first main body 21 with the hands H can operate the push button mechanism 26 with thumbs T. As illustrated in FIG. 14, the third usage pattern U3 is such that the first main body 21 and the second main body 22 are unfolded relatively widely, and a margin portion 21*h* on one side in the width direction of the first main body 21 and a margin portion 22*f* on one side in the width direction of the second main body 22 are held with the hands H. Herein, as far as the view of the user is concerned, the second usage pattern U2 is identical to the first usage pattern U1. However, as opposed to placing the PC 20 on a desk in the first usage pattern U1, the second usage pattern U2 is such that the PC 20 is held with the hands H while standing or sitting. Regarding the third usage pattern U3, the orientation of the display screens 25*a* and 28*a* of the display panels 25 and 28, respectively, is different by about 90° as compared to the orientation in the first usage pattern U1 and the second usage pattern U2.

Thus, the PC 20 according to the present embodiment can be used in the first orientation P1 (i.e., in the first usage pattern U1 and the second usage pattern U2, see FIGS. 12 and 13) in which a side 28*b* of the display screen 28*a* of the display panel 28 is positioned on the upper side and can be used in the second orientation P2 (i.e., in the third usage pattern U3, see FIG. 14) in which another side 28*c* of the display screen 28*a* of the display panel 28 as well as a side 25*b* of the display screen 25*a* of the display panel 25 are positioned on the upper side. The side 28*b* of the display screen 28*a* is distantly positioned from a boundary Bd between the first main body 21 and the second main body 22, while the other side 28*c* of the display screen 28*a* and the side 25*b* of the display screen 25*a* are positioned to face each other across the boundary Bd.

In the present embodiment, the first orientation P1 for the two display screen 28*a* also represents a third orientation P3 for the display screens 28*a* and 25*a*, while the second orientation P2 for the display screen 28*a* also represents a fourth orientation P4 for the two display screens 28*a* and 25*a*.

Herein, each of the display panels 25 and 28 is formed in the shape of a flat rectangular parallelepiped, and receives display signals from control circuits (not illustrated) configured with the electronic components mounted on the circuit board 31*a*. Moreover, each of the display panels 25 and 28 displays video including still images and moving images. In the present embodiment, the light that represents the video displayed on the display screens 25*a* and 28*a* of the display panels 25 and 28, respectively, is output anteriorly via the display panels 25 and 28, respectively, which are colorless and transparent in nature. The control circuits in the PC 20 include a control module, a memory module (such as a ROM, a RAM, or an HDD), an interface circuit, and various controllers. Meanwhile, the PC 20 also has built-in speakers (not illustrated) for the purpose of audio output.

Moreover, in an identical manner to the first embodiment, the abovementioned control circuits in the present embodiment also include the video control mechanism 11 (see FIG. 3) for the purpose of controlling the video to be displayed on the display screens 25*a* and 28*a* of the display panels 25 and 28, respectively, depending on the orientation of the first main body 21 and the second main body 22, respectively. Hence, even in the PC 20 according to the present embodiment, in an identical manner to the first embodiment, when the first main body 21 and the second main body 22 have the first orientation P1 (see FIGS. 12 and 13), the video is displayed with a side 25*c* of the display screen 25*a* and the side 28*b* of the display screen 28*a* positioned on the upper side. In contrary, when the first main body 21 and the second main body 22 have the second orientation P2 (see FIG. 14), the video is displayed with the side 25*b* of the display screen 25*a* and the side 28*c* of the display screen 28*a* positioned on the upper side. Meanwhile, if the first main body 21 and the second main body 22 have an orientation other than the first orientation P1 or the second orientation P2, then no video signals corresponding to that orientation are displayed, and, for example, either video signals corresponding to either one of the first orientation P1 and the second orientation P2 are displayed or no video signals are displayed at all. Hence, the video displayed on the display screens 25*a* and 28*a* can be used to urge the user to set the orientation to either one of the defined orientations P1 and P2. Thus, in the present embodiment, the operations of the video control mechanism 11 make it possible to restrain the user from setting the first main body 21 and the second main body 22 in an orientation other than the first orientation P1 or the second orientation P2. Moreover, in the present embodiment also, for the case when the first main body 21 and the second main body 22 are set in an incorrect orientation, the video control mechanism 11 can be configured to control the video signal processing circuit 12 in such a way that certain characters or images are displayed for the purpose of notifying the user that the first main body 21 and the second main body 22 are not in a correct orientation or that the first main body 21 and the second main body 22 need to be set in a correct orientation. Furthermore, it is also possible to configure an audio control mechanism (not illustrated) in the control circuits so that the user can be notified by audio about the fact that the first main body 21 and the second main body 22 are not in a correct orientation or that the first main body 21 and the second main body 22 need to be set in a correct orientation. Meanwhile, the constituent elements of the video control mechanism 11 are installed inside either the housing 21a of the first main body 21 or the housing 22a of the second main body 22. However, it is preferable that the constituent elements of the video control mechanism 11 are installed inside the housing 22a of the second main body 22, which also houses the circuit board assembly 31 on which are configured the essential parts of the control circuits.

Moreover, as illustrated in FIG. 11, rough portions 39 are formed on those portions of the first main body 21 and the second main body 22 which are held by the user with the hands H in the first orientation P1 and the second orientation P2. The rough portions 39 can be formed as, for example, a plurality of small protrusions or irregularities, or mesh-like groves, or depressions or salient walls matching with the shapes of the fingers of the hands H. Such a configuration helps in impressing upon the user that, while using the PC 20 in the correct orientations P1 and P2, the rough portions 39 need to be held with the hands H. Moreover, by giving the user a feeling of strangeness when the portions other than the rough portions 39 (e.g., the smooth portions) are held, it becomes possible to restrain the user from setting the PC 20 in an orientation other than the first orientation P1 or the second orientation P2. In the present embodiment, the rough portions 39 represent orientation notifying elements for tactually notifying the user that the correct orientation is set.

As illustrated in FIGS. 9 and 10, the CPU 38 that is an exothermic electronic component is mounted on the circuit board 31a. On the die (not illustrated) of the CPU 38 is mounted a heat releasing block 38a, and on the heat releasing block 38a is mounted a heat receiving portion 41a of a heat pipe 41 that functions as a heat transfer mechanism. The heat receiving portion 41a is pressed against the heat releasing block 38a with a pressing member 42, which is fixed to the circuit board 31a using a screw 43 that is a fastening member. In such a configuration, the heat generated by the exothermic CPU 38 is transferred to the heat receiving portion 41a via the heat releasing block 38a.

The heat pipe 41 functioning as the heat transfer mechanism is a pipe having, for example, an elongated flattened cross-section and is made of a metallic component (such as copper alloy) having relatively high heat conductivity. One end of that pipe constitutes the heat receiving portion 41a, while the other end thereof constitutes a heat releasing portion 41b. The portion in between the heat receiving portion 41a and the heat releasing portion 41b is a heat transferring portion 41c. On the outside of the heat releasing portion 41b are attached a plurality of fins 41d that are made of thin sheets of a metallic component (such as copper alloy) having relatively high heat conductivity. Moreover, inside the housing 22a, at a position adjacent to the heat releasing portion 41b is installed a fan 40 that has a thin flat appearance in the thickness direction of the circuit board 31a and that comprises a rotor (not illustrated) rotating around a rotary shaft positioned along the perpendicular direction to the front and rear sides of the circuit board 31a. The rotor of the fan 40 is rotated using an electric motor so that, for example, the air that is taken in from the housing 22a through air inlets 40a formed on both sides of the axial direction of the rotary shaft (i.e., formed on the front side and on the rear side) is discharged through an exhaust outlet (not illustrated) formed opposite to the heat releasing portion 41b. That is, the air flow discharged by the fan 40 reaches the heat releasing portion 41b and the fins 41d, as a result of which the heat releasing portion 41b and the fins 41d are subjected to cooling. Meanwhile, the fan 40 is fit in an L-shaped notch 31b formed at a corner of the circuit board 31a. Herein, the heat pipe 41 functions in an identical manner to the heat pipe 7 according to the first embodiment.

Figure 15A:
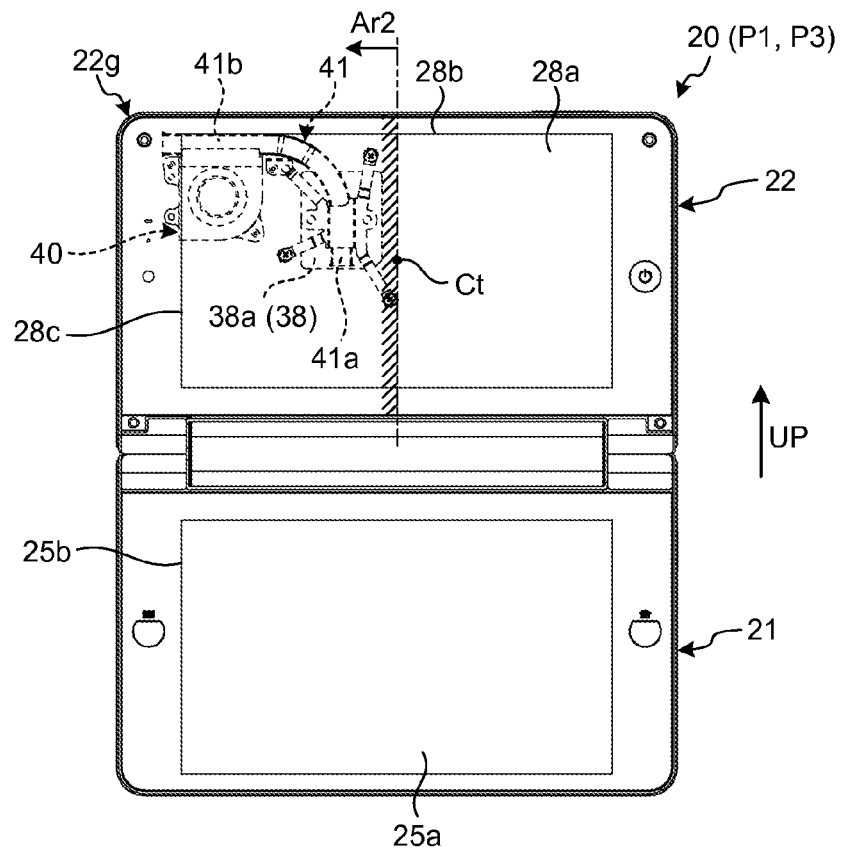
FIG. 15A is an exemplary plan view of a third orientation of the PC in the third embodiment.
Figure 15B:
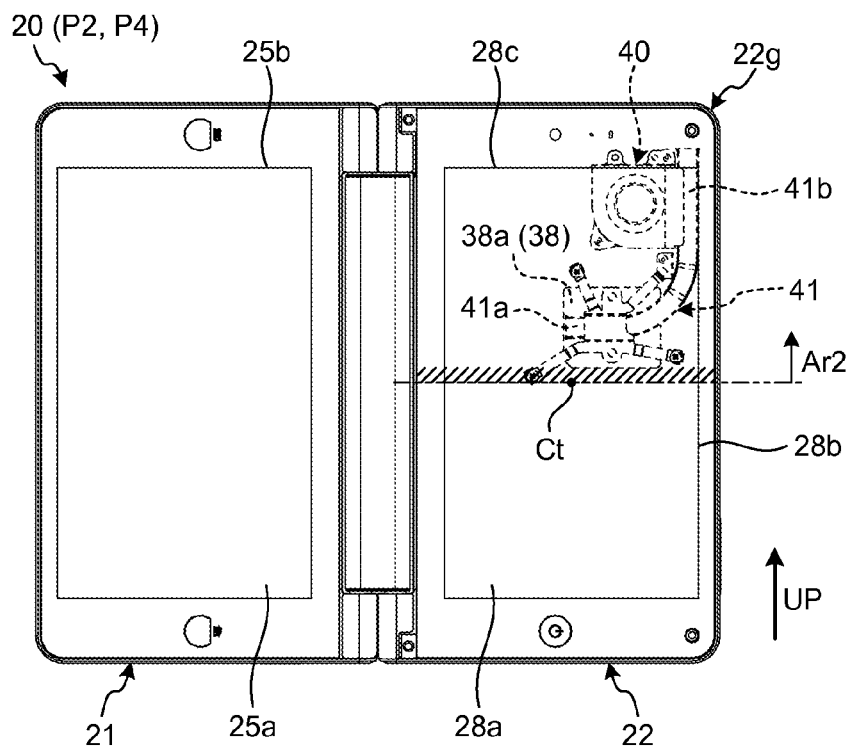
FIG. 15B is an exemplary plan view of a fourth orientation of the PC in the third embodiment.

As illustrated in FIGS. 15A and 15B, in the present embodiment also, the heat receiving portion 41a is positioned on the lower side of the heat releasing portion 41b in both of the first orientation P1 (FIG. 15A) and the second orientation P2 (FIG. 15B) in an identical manner to the first embodiment. In the heat pipe 41 functioning as the heat transfer mechanism, in case the heat receiving portion 41a is positioned on the upper side of the heat releasing portion 41b thereby forming what is called a top heat condition, then the heat transfer medium in the liquid state does not easily return to the heat receiving portion 41a from the heat releasing portion 41b. That causes a decline in the heat transfer efficiency, that is, in the heat releasing efficiency. In view of this, in the present embodiment, the heat receiving portion 41a is positioned on the lower side of the heat releasing portion 41b in both of the first orientation P1 and the second orientation P2 that are defined to be the correct orientations. Hence, it becomes possible to prevent the heat transfer efficiency, that is, the heat releasing efficiency from declining, which may happen if the heat receiving portion 41a is positioned on the upper side of the heat releasing portion 41b.

Moreover, as illustrated in FIGS. 9, 10, 15A and 15B, in the present embodiment also, the heat releasing portion 41b is disposed at a corner 22g that lies at the upper end of the housing 22a in both of the first orientation P1 and the second orientation P2. Since the heat is prone to rise inside the housing 22a due to the air current, disposing the heat releasing portion 41b at the corner 22g that lies at the upper end of the housing 3a in both of the first orientation P1 and the second orientation P2 makes it possible to prevent heat accumulation from occurring inside the housing 22a.

Furthermore, as illustrated in FIGS. 9, 10, and 11, in the present embodiment, an exhaust outlet 22h is formed on a side wall 22i at the corner 22g of the housing 22a. Thus, the air flow, which is generated by the fan 40 and which gets heated by passing through the heat releasing portion 41b formed at the corner 22g, is discharged more smoothly from the exhaust outlet 22h that is formed at the corner 22g of the housing 22a and that faces the heat releasing portion 41b from up close. As a result, heat accumulation is prevented from occurring inside the housing 22a.

As illustrated in FIGS. 15A and 15B, in the present embodiment, when viewed from the front of the display screen 28a (i.e., when viewed along the line of sight of FIGS. 15A and 15B), the exothermic CPU 38 is disposed in a rectangular area Ar2 that lies on the upper side of the center Ct of the second main body 22 in the second orientation P2. Hence, the ascending air current generated inside the housing 22a due to the heat of the exothermic CPU 38 or the air flow drawn in the fan 40 travels a relatively long distance inside the housing 22a. AS a result, it becomes possible to prevent occurrence of a situation in which the electronic components disposed over a wide area inside the housing 22a are easily affected due to the heat. Moreover, if it is assumed that the exothermic CPU 38 lies at the center Ct, then there is a possibility that the heated air accumulates in the area on the opposite side of the exhaust outlet 22h with respect to the center Ct inside the housing 22a (i.e., on the opposite side of the corner 22g). In view of this, in the present embodiment, in both of the first orientation P1 and the second orientation P2, the exothermic CPU 38 is disposed in the area on the side of the exhaust outlet 22h with respect to the center Ct (i.e., on the side of the corner 22g). Consequently, the heated air can be easily discharged to the outside of the housing 22a. Moreover, in the present embodiment, at the time of holding the second main body 22 with the hands H, usually the user holds with the hands H the opposite side of the rectangular area Ar2 positioned on the lower side of the center Ct in each orientation (see FIGS. 13 and 14). That is, the user happens to hold with the hands H an area that is distantly positioned from the CPU 38 or the heat pipe 41. Therefore, the user is spared from holding with the hands H that area of the housing 22a which becomes warm due to the heat from the CPU 38 or the heat pipe 41. Thus, while holding the PC 20 with the hands H, the user is spared from experiencing any sense of discomfort that may occur due to the warming of the housing 22a.

Moreover, in the present embodiment, as illustrated in FIGS. 10 and 11, air inlets 22j are formed close to the boundary Bd between the first main body 21 and the housing 22a of the second main body 22. Thus, in the present embodiment, since the air inlets 22j are distantly positioned from the exhaust outlet 22h, a wider area inside the housing 22a is subjected to cooling by the air flow that is let inside the housing 22a from the air inlets 22j and that flows toward the exhaust outlet 22h.

Furthermore, as illustrated in FIG. 10, the air inlets 22j are formed on the outer side of the circuit board 31a, that is, on the outside of an end edge 31e of the circuit board 31a in the direction along the surface of the circuit board 31a. As a result, the air flow let in from the air inlets 22j gets easily distributed on the front side as well as on the rear side of the circuit board 31a, so that the electronic components installed on the front side as well as on the rear side are subjected to cooling without difficulty. Meanwhile, it is also possible to form the air inlets 22j opposite to the end edge 31e of the circuit board 31a.

Figure 16:
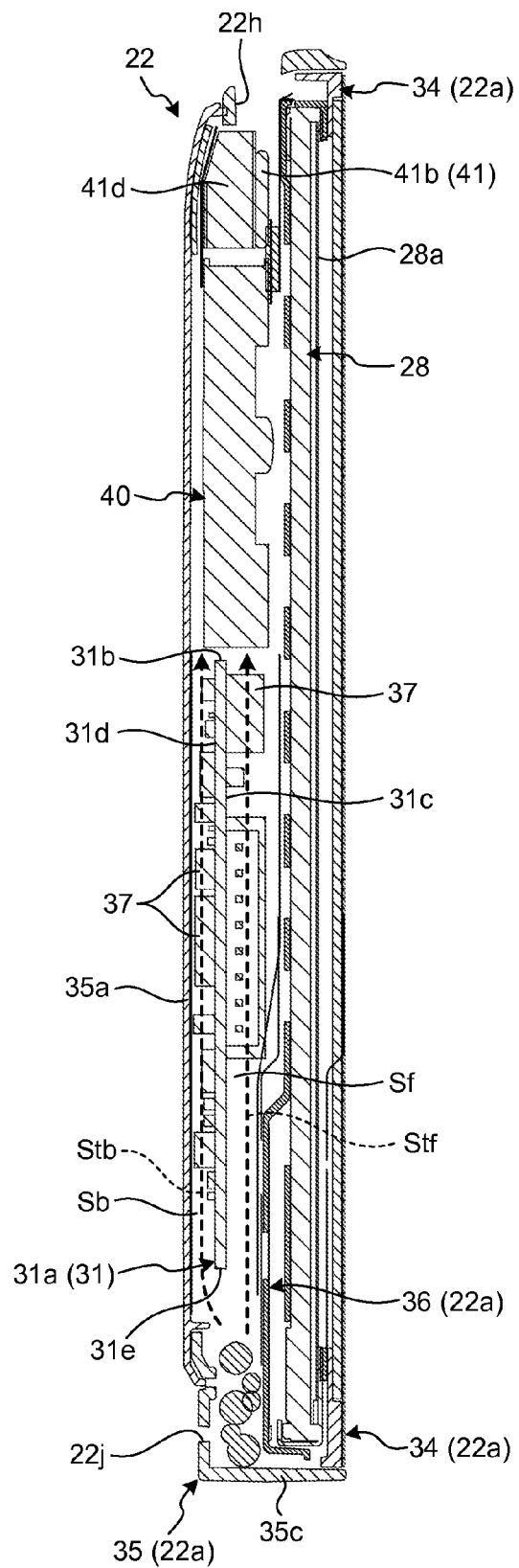
FIG. 16 is a cross-sectional view along line XVI-XVI in FIG. 8 in the third embodiment.
Figure 17:
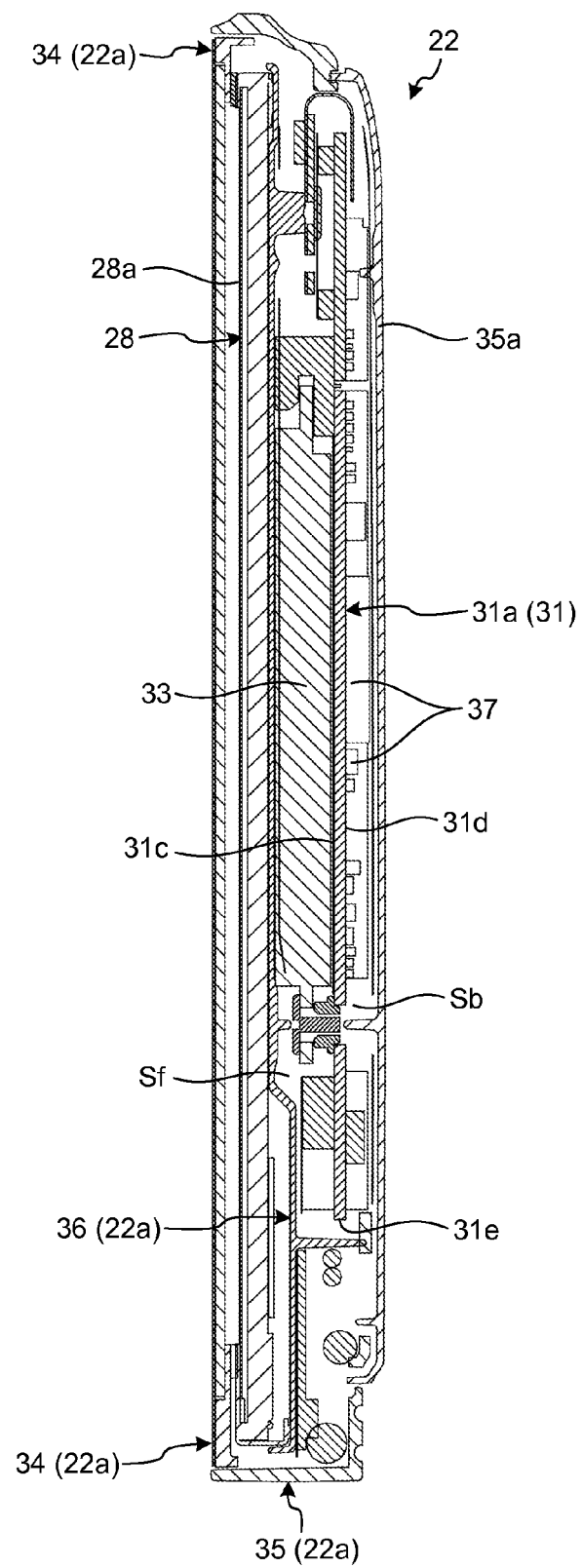
FIG. 17 is a cross-sectional view along line XVII-XVII in FIG. 8 in the third embodiment.

As illustrated in FIGS. 16 and 17, the housing 22a of the second main body 22 comprises a mask 34 and a case 35 constituting the outer housing and comprises an inner plate 36 as the inner housing. The mask 34 and the case 35 constituting the outer housing are integratedly coupled by screwing, engagement, or fitting, and form the outline of the housing 22a. The inner plate 36 as the inner housing is screw-clamped to the mask 34 or the case 35 (herein, for example, the case 35) constituting the outer housing. The housing 22a houses the display panel 28 that has the display screen 28a exposed on the front side, and also houses the circuit board assembly 31. The inner plate 36 is disposed in between the display panel 28 and the circuit board 31a (the circuit board assembly 31), that is, disposed at a position that is behind the display panel 28 (i.e., on the left side in FIG. 16, on the right side in FIG. 17) and that is in front of the circuit board 31a. To the inner plate 36, the circuit board 31a is fixed using a screw (not illustrated) that is a fastening member. Moreover, the display panel 28 is supported by the inner plate 36 and the mask 34.

As illustrated in FIGS. 9 and 10, the circuit board 31a is rectangular in shape and has the notch 31b formed thereon. Moreover, in the present embodiment, as illustrated in FIGS. 16 and 17, a plurality of electronic components 37 are mounted on a front face 31c and a rear face (reverse face) 31d of the circuit board 31a. In the present embodiment, the relatively taller electronic components 37 are mounted on the front face 31c, while the relatively shorter electronic components 37 are mounted on the rear face 31d. Thus, as compared to the case when the relatively taller electronic components 37 are mounted on the front face 31c as well as on the rear face 31d, the height (thickness) of the circuit board assembly 31 comprising the circuit board 31a and the electronic components 37 can be prevented from increasing.

Moreover, in the present embodiment, as illustrated in FIGS. 9, 10, and 17, a solid state drive (SSD) 33 is disposed as one of the electronic components 37. The SSD 33 is relatively taller (relatively thicker) and has a larger mounting area on the front face 31c of the circuit board 31a. As illustrated in FIGS. 9 and 10, the SSD 33 is disposed on the opposite side (right side in FIGS. 9 and 10) to the side (left side in FIGS. 9 and 10) at which the CPU 38 and the fan 40 are disposed, and is disposed as a partition within a space Sf (see FIGS. 16 and 17) in between the front face 31c of the circuit board 31a and the inner plate 36. That is, in the present embodiment, by disposing the SSD 33 away from and on the opposite side of the CPU 38 and the fan 40, the space Sf can be widened on the side of the CPU 38 and the fan 40 with respect to the SSD 33 so that airflow Stf can flow with more flow rate in the space Sf.

Moreover, as illustrated in FIGS. 10 and 11, the air inlets 22j (i.e., small hole areas) are formed in a relatively elongated area along an end edge 35b of the case 35. Once the second main body 22 is assembled, the end edge 31e on the base end side (hinge mechanism side) of the circuit board 31a is distantly positioned from the end edge 35b of the case 35. As a result, inside the housing 22a, an airflow introduction portion is formed from the air inlets 22j, which are formed on the outer side of the end edge 31e (downside in FIG. 10) and on a bottom wall 35a of the case 35, toward the space Sf formed in between the front face 31c of the circuit board 31a and the inner plate 36. Moreover, on the front face 31c of the circuit board 31a, the SSD 33 is disposed on a distant side from the end edge 31e. Because of such a combination, in the space Sf formed in between the front face 31c of the circuit board 31a and the inner plate 36 (see FIG. 16), the airflow Stf indicated by dashed arrow in FIGS. 10 and 16 is formed from the air inlets 22j toward the exhaust outlet 22h. Also in a space Sb formed in between the back face of the circuit board 31a and bottom wall 35a of the case 35, the airflow Stb indicated by dashed arrow in FIG. 16 is formed from the air inlets 22j toward the exhaust outlet 22h.

While the abovementioned embodiments are described as being applied to a television apparatus or a notebook PC having two display screens, the embodiments may be applicable to other electronic devices having at least a single display screen such as computers (notebook computers or desktop computers), personal digital assistants (PDAs), smartbooks, or cellular phones having a single display screen.

Moreover, regarding the display device, the display screen, the display panel, the housing, the exothermic component, the heat transfer mechanism, the electronic component, the fan, the exhaust outlet, the air inlet, the orientation notifying element, the display element, the rough portion, and the hinge mechanism, the specifications (method, structure, shape, material, size, number, direction, type, arrangement, etc.) can be suitably modified.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a display device comprising a rectangular display screen, the display device configured to be used in a first orientation in which a first side of the display screen is positioned on an upper side, and in a second orientation in which a second side of the display screen is positioned on the upper side, wherein the first side is perpendicular to the second side;
a housing configured to house at least part of the display device, the housing comprising an air inlet and an exhaust outlet;
a heat source housed in the housing and located opposite the display screen with respect to the display device; and
a heat transfer mechanism at least partially housed in the housing, the heat transfer mechanism comprising a heat receiving portion configured to receive heat from the heat source, a heat releasing portion configured to release heat, and a heat transferring portion configured to house a medium configured to transfer heat from the heat receiving portion to the heat releasing portion, wherein
a connection portion between the heat receiving portion and the heat transferring portion is below a connection portion between the heat releasing portion and the heat transferring portion both when the display device is in the first orientation and when the display device is in the second orientation,
the exhaust outlet faces the heat releasing portion, and
at least part of the air inlet comprises an opening in a surface of the housing located opposite the display screen and is positioned separately from the exhaust outlet.

2. The electronic device of claim 1, wherein:
the heat releasing portion is in a corner at an upper end of the housing both when the display device is in the first orientation and when the display device is in the second orientation.

3. The television apparatus electronic device of claim 1, wherein
the housing comprises the air inlet and the exhaust outlet, wherein the exhaust outlet is located at a corner at an upper end of the housing both when the display device is in the first orientation and when the display device is in the second orientation.

4. The electronic device of claim 1, wherein the heat source is located in an area above a center in the housing in a front view of the display screen both when the display device is in the first orientation and when the display device is in the second orientation.

5. The electronic device of claim 1, further comprising:
a sensor configured to detect the orientation of the display device; and
a controller configured to change a vertical direction of the display screen to a direction corresponding to either one of the first orientation and the second orientation based on a detection result of the sensor, wherein
the controller is configured not to change the vertical direction of the display screen to a direction corresponding to an upside down orientation of the first orientation and a direction corresponding to an upside down orientation of the second orientation.

6. The electronic device of claim 1, further comprising:
a second display device comprising a rectangular second display screen; and
a second housing configured to house at least part of the second display device and to be connected to the housing via a hinge to be rotatable between a folded state and an open state, wherein the second display screen is close to the display screen and faces the display screen in the folded state, and wherein the second display screen is located opposite the first side of the display screen and the display screen and the second display screen are open in the open state.

7. The electronic device of claim 6, wherein
the housing comprises the air inlet and the exhaust outlet wherein the air inlet is located at an end of the housing on a side of the second housing.

8. The electronic device of claim 6, wherein the second housing comprises a battery as a power supply.

9. The electronic device of claim 1, further comprising an orientation notifying element configured to notify a user that the display device is in at least one of the first orientation and the second orientation.

10. An electronic device comprising:
a display device comprising a display screen display on which is switchable between a first orientation and a second orientation in which the display device is rotated 90 degrees from the first orientation;
a housing configured to house at least part of the display device;
a heat source housed in the housing and located at a position overlapping the display device; and
a heat transfer mechanism comprising a heat receiving portion configured to receive heat from the heat source, a heat releasing portion, and a heat transferring portion configured to house a medium, wherein the heat transferring portion extends from the heat receiving portion to the heat releasing portion, and a connection portion between the heat releasing portion and the heat transferring portion is above a connection portion between the heat receiving portion and the heat transferring portion both when the display device is in the first orientation and when the display device is in the second orientation.

11. The electronic device of claim 10, wherein the heat releasing portion is in a corner at an upper end of the housing both when the display device is in the first orientation and when the display device is in the second orientation.

12. The electronic device of claim 10, wherein the housing comprises an air inlet and an exhaust outlet, wherein the exhaust outlet is located at a corner at an upper end of the housing both when the display device is in the first orientation and when the display device is in the second orientation.

13. The electronic device of claim 10, wherein the heat source is located in an area above a center in the housing in a front view of the display screen both when the display device is in the first orientation and when the display device is in the second orientation.

14. The electronic device of claim 10, further comprising:
a sensor configured to detect the orientation of the display device; and
a controller configured to change a vertical direction of the display screen to a direction corresponding to either one of the first orientation and the second orientation based on a detection result of the sensor, wherein
the controller is configured not to change the vertical direction of the display screen to a direction corresponding to an upside down orientation of the first orientation and a direction corresponding to an upside down orientation of the second orientation.

15. The electronic device of claim 10, further comprising:
a second display device comprising a rectangular second display screen; and
a second housing configured to house at least part of the second display device and to be connected to the housing via a hinge to be rotatable between a folded state and an open state, wherein the second display screen is close to the display screen and faces the display screen in the folded state, and wherein the second display screen is located opposite a side of the display screen and the display screen and the second display screen are open in the open state.

16. The electronic device of claim 15, wherein the housing comprises an air inlet and an exhaust outlet, wherein the air inlet is located at an end of the housing on a side of the second housing.

17. The electronic device of claim 15, wherein the second housing comprises a battery as a power supply.

18. The electronic device of claim 10, further comprising an orientation notifying element configured to notify a user that the display device is in at least one of the first orientation and the second orientation.

19. An electronic device comprising:
a display device comprising a rectangular display screen, the display device configured to be used in a first orientation in which one side of the display screen is positioned on an upper side, and in a second orientation in which another side of the display screen is positioned on the upper side, wherein the one side is perpendicular to the other side;
a housing configured to house at least part of the display device, the housing comprising an air inlet and an exhaust outlet;
a heat source housed in the housing and located opposite the display screen with respect to the display device; and
a heat transfer mechanism at least partially housed in the housing, the heat transfer mechanism comprising a heat receiving portion configured to receive heat from the heat source, a heat releasing portion configured to release heat, and a heat transferring portion configured to transfer heat from the heat receiving portion to the heat releasing portion, wherein
the heat receiving portion is below the heat releasing portion both when the display device is in the first orientation and when the display device is in the second orientation,
the exhaust outlet faces the heat releasing portion, and
at least part of the air inlet comprises an opening in a surface of the housing located opposite the display screen and is positioned separately from the exhaust outlet, and, in a front view of the display screen being used, is positioned separately from periphery of the electronic device.

* * * * *